United States Patent [19]
Mehta et al.

[11] Patent Number: 5,789,269
[45] Date of Patent: Aug. 4, 1998

[54] FIELD IMPLANT FOR SEMICONDUCTOR DEVICE

[75] Inventors: Sunil Mehta, San Jose; Jonathan Lin, Milpitas, both of Calif.

[73] Assignee: Advanced Micro Devices, Inc., Sunnyvale, Calif.

[21] Appl. No.: 692,688

[22] Filed: Aug. 6, 1996

Related U.S. Application Data

[62] Division of Ser. No. 501,230, Jul. 11, 1995, Pat. No. 5,604,370.

[51] Int. Cl.$^6$ ............................................. H01L 21/76
[52] U.S. Cl. ........................ 437/70; 437/69; 437/27
[58] Field of Search ......................... 437/69, 70, 72, 437/73, 27

[56] References Cited

U.S. PATENT DOCUMENTS

| | | |
|---|---|---|
| 3,936,858 | 2/1976 | Seeds et al. . |
| 4,829,019 | 5/1989 | Mitchell et al. ........................ 437/69 |
| 4,918,510 | 4/1990 | Pfiester . |
| 4,965,221 | 10/1990 | Dennison et al. ........................ 437/69 |
| 5,151,381 | 9/1992 | Liu et al. . |
| 5,192,707 | 3/1993 | Hodges et al. ........................ 437/69 |
| 5,422,297 | 6/1995 | Yamauchi ........................ 437/70 |

FOREIGN PATENT DOCUMENTS

| | | |
|---|---|---|
| 56-101778 | 8/1981 | Japan . |
| 3-016154 | 1/1991 | Japan . |
| 3-283574 | 12/1991 | Japan . |
| 4-011550 | 4/1992 | Japan . |

OTHER PUBLICATIONS

Wolf, Silicon Processing for the VLSI Era—vol. II—Process Integration, Littice Press, 1990, pp. 22–23, Sections 2.2.2.4 and 2.2.2.5.

Rung et al., A Retrograde p–Well for Higher Density CMOS, IEEE Transactions on Electron Devices, vol. ED–28, No. 10, Oct., 1981, pp. 1115–1119.

*Primary Examiner*—Trung Dang

[57] ABSTRACT

The concentration of impurities at the surface of the semiconductor device adjacent and under the bird's beak of a field oxide region is reduced by employing sidewall spacers prior to field implantation. The resulting semiconductor device exhibits reduced sidewall junction capacitance and leakage, an increased junction breakdown voltage and a reduced narrow channel effect.

14 Claims, 4 Drawing Sheets

FIELD IMPLANT FOR SEMICONDUCTOR DEVICE

This application is a division of application Ser. No. 08/501,230 filed Jul. 11, 1995 now U.S. Pat. No. 5,604,370.

TECHNICAL FIELD

The present invention relates to a semiconductor device comprising a field implant or channel-stopper region, and to a method of manufacturing the semiconductor device. The invention has particular applicability in semiconductor devices designed for high-voltage technology.

BACKGROUND ART

Conventional methods of manufacturing semiconductor devices comprise the formation of field oxide regions for isolating active regions in the surface of a semiconductor substrate. The field oxide regions are unavoidably formed with an end portion, which borders the active region, which end portion resembles and, therefore, is commonly referred to as a "bird's beak." See, for example, Liu et al., U.S. Pat. No. 5,151,381.

Conventional methods of forming a field oxide region typically comprise depositing a first or pad-oxide layer on the semiconductor substrate, and depositing a nitride layer thereon. Patterning and etching are then conventionally conducted to form openings extending to and exposing the semiconductor substrate and side surfaces of the nitride and pad-oxide layers. The openings define areas on the surface of the semiconductor substrate in which field oxide regions are subsequently thermally formed, while the areas under the pad-oxide represent future active regions. A channel-stopper region or field implant is then formed in the semiconductor substrate, using the pad-oxide and nitride layers as a mask, under the region wherein the field oxide region is to be subsequently formed. Thus, the field implantation involves the ion implantation of an impurity having the same conductivity as the impurity in the semiconductor substrate. In N-MOS circuits, a P$^+$ implantation of boron is typically employed.

There are known problems associated with channel-stopper regions. See, for example, Wolf, Silicon Processing for the VLSI Era—Volume II—Process Integration, Lattice Press, 1990, pp. 22—23, Sections 2.2.2.4 and 2.2.2.5., wherein it is recognized that during field oxidation, the channel-stop implant experiences segregation and oxidation enhanced diffusion. Consequently, relatively high doses are required to achieve an acceptable field threshold voltage, and the peak of the implant must be deep enough so that it is not absorbed by the growing field-oxide interface. If the channel-stop doping is too heavy, high source/drain-to-substrate capacitances result. In addition, the heavy channel-stop doping reduces the source/drain-to-substrate pn junction breakdown voltages. It is also disclosed that, as a result of lateral diffusion, the field implant impurity encroaches on the active regions, thereby increasing the threshold voltage for narrow channel widths. In addition, dislocations generated during the channel-stop implant penetrate nitride-edge-defined junctions causing increased emitter-base leakage in bipolar devices. Wolf reports that prior attempts to address such problems attendant upon field implants include the use of high pressure oxidation to grow the field oxide region, a geranium-boron co-implant, and a chlorine implant.

There exists, however, a need for an efficient simplified technique to overcome the problems associated with the formation of a field implant or channel-stopper region under the field oxide region, particularly a solution to the narrow channel effect, notably at high voltages, high junction peripheral capacitance and low junction breakdown voltages. This need is particularly acute for circuits that employ high voltages on or across the field isolation region.

DISCLOSURE OF THE INVENTION

An object of the present invention is a semiconductor device having a high junction breakdown voltage and high operating speed.

Another object of the invention is a method of manufacturing a semiconductor device having a high junction breakdown voltage and high operating speed.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a semiconductor substrate having an impurity of a first conductivity type; a field oxide region having an edge adjoining an isolated active region; a channel-stopper region under the field oxide region, which channel-stopper region contains an impurity of the first conductivity type at a concentration greater than the concentration of the impurity of the first conductivity type in the substrate; wherein, the channel-stopper region does not extend to the surface of the semiconductor substrate.

Another aspect of the invention is a method of manufacturing a semiconductor device, which method comprises: forming a first oxide layer on a semiconductor substrate, wherein the semiconductor substrate contains an impurity of a first conductivity type; forming a nitride layer on the first oxide layer; patterning and etching the nitride and first oxide layers to form openings extending to and exposing the semiconductor substrate, and forming and exposing side surfaces of the first oxide and nitride layers; depositing a second oxide layer on the exposed surface of the semiconductor substrate, top surface of the nitride layer and exposed side surfaces of the nitride and first oxide layers; etching to remove the second oxide layer from the semiconductor substrate and top surface of the nitride layer leaving sidewall spacers of the second oxide on the side surfaces of the nitride and first oxide layers, which sidewall spacers extend to the surface of the semiconductor substrate; and ion implanting an impurity of the second conductivity type into the substrate in a region between the sidewall spacers to form a channel-stopper region containing the impurity of the second conductivity type at a concentration greater than the concentration of the impurity of the second conductivity type in the substrate.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention addresses and solves problems attendant upon conventional field implants or channel-stopper regions formed under a field oxide region, and the manner in which conventional channel-stopper regions are formed. As disclosed by Wolf, a channel-stopper region is conventionally formed by ion implantation after etching the pad-oxide and nitride layers to define the active regions. A channel-stopper region, such as a $P^+$ channel-stopper region by ion implantation under the field oxide layer, is typically formed to prevent interaction between two adjacent transistors.

Figure 1:
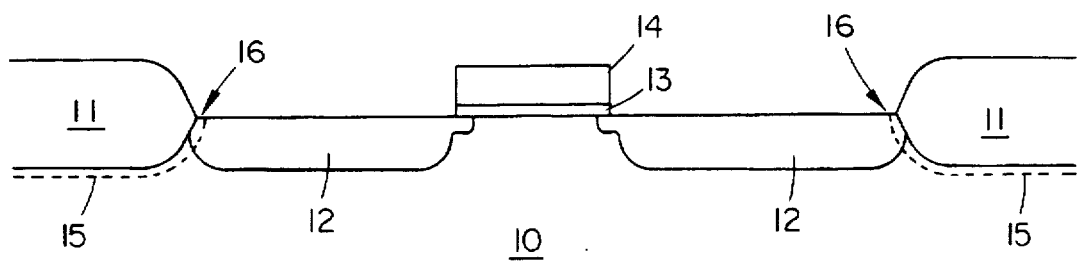
FIG. 1 illustrates a section of a conventional semiconductor device having a channel-stopper region.

FIG. 1 schematically depicts a portion of a conventional semiconductor device comprising semiconductor substrate 10 containing a P-type impurity. Field oxide regions 11 formed in the surface of semiconductor substrate 10 isolate an active region comprising spaced apart source/drain regions 12 containing an N-type impurity. Source/drain regions are separated by a channel region over which is positioned gate electrode 14 with gate oxide 13 therebetween. The channel-stopper region 15 extends under field oxide regions 11 encroaching into source/drain regions 12 to the surface of the semiconductor substrate proximate the end or bird's beak portions of field oxide regions 11 as indicated at 16.

The presence of P-type impurities at the bird's beak of the field oxide regions, and in the source/drain regions to the surface of the semiconductor substrate generates various problems as reported by Wolf, notably a narrow channel effect, high sidewall junction peripheral capacitance and low junction breakdown voltage. The present invention addresses and solves these problems by reducing the amount of the impurities forming the channel-stopper region under the bird's beaks of the field oxide regions. In a preferred embodiment, the channel-stopper impurities do not extend into the source/drain regions and, most preferably, do not extend to the surface of the semiconductor substrate approximate the bird's beak portion.

Figure 2:
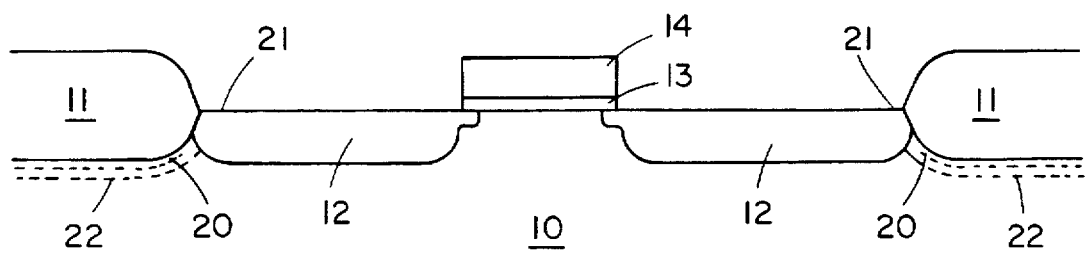
FIG. 2 illustrates an embodiment of the present invention comprising channel-stopper regions.

Thus, in accordance with the present invention, a semiconductor device as shown in FIG. 2 is provided, wherein elements similar to those of the semiconductor device depicted in FIG. 1 bear similar reference numerals. As shown in FIG. 2, the channel-stopper region 20 is formed so that it does not extend under the bird's beak portion of field oxide regions 11, into the source/drain region, or channel region and to the surface of the semiconductor substrate as shown at 20. The reduced channel-stopper impurity P-concentration at the end of the field oxide region yields several advantageous results, such as a significant reduction in the narrow-channel effect, a reduction of the sidewall junction capacitance and an increase in the junction breakdown voltage. These resulting advantages are particularly useful in semiconductor devices designed for high-voltage technology which require heavy field implants. Moreover, by the present invention, manufacturing is simplified and the resulting semiconductor devices exhibit higher operating speeds.

The tailoring of the channel-stopper region so that it does not extend to the terminal portion of the bird's beak of the field oxide region, particularly into the source/drain regions, or channel region and to the surface of the semiconductor substrate approximate the bird's beak region, is achieved by providing sidewall spacers on the pad-oxide and nitride patterned masking layers prior to formation of the channel-stopper region by ion implantation. An embodiment of a method according to the present invention in which a reduced channel-stopper impurity concentration is achieved at the bird's beak of a field oxide region is illustrated by the sequential manipulative steps or stages depicted in FIGS. 3 through 8, wherein similar elements bear similar reference numerals.

Figure 3:
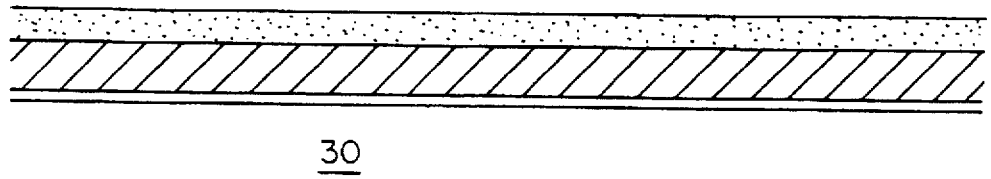
FIGS. 3 through 8 schematically depict a sequence of manipulative steps in accordance with the method of the present invention.

As shown in FIG. 3, a first oxide layer or pad-oxide layer 31 is formed on semiconductor substrate 30, which semiconductor substrate 30 contains an impurity of a first type conductivity, typically a P-type impurity. Nitride layer 32 is then formed on the pad oxide layer. Typically, the pad oxide layer is formed by thermal treatment, while the nitride layer can formed by chemical vapor deposition. As an optional step, an intermediate oxide layer 33, such as silicon dioxide, is deposited on nitride layer 32, as by chemical vapor deposition. As those having ordinary skill in the art are aware, stress increases exponentially with increased nitride thickness. Accordingly, there is a practical limit on the thickness of the nitride layer, although a higher thickness of nitride layer reduces the undesirable formation of the bird's beak structure. Therefore, the optional oxide layer 33 is useful for optimizing the width of the subsequently formed sidewall spacer.

After deposition of pad-oxide 31, nitride 32 and optional intermediate oxide 33 layers, patterning is conducted by conventional photolithographic techniques followed by a conventional etching technique to form openings defining areas in which the field oxide regions will subsequently be formed by thermal treatment. The formed openings expose the semiconductor substrate, and form and expose side surfaces of pad oxide 31, nitride 32 and optional intermediate oxide 33 layers. Active regions will subsequently be formed in the surface of semiconductor substrate 30 under the remaining pad oxide 31 and nitride 32 masking layers.

Figure 4:
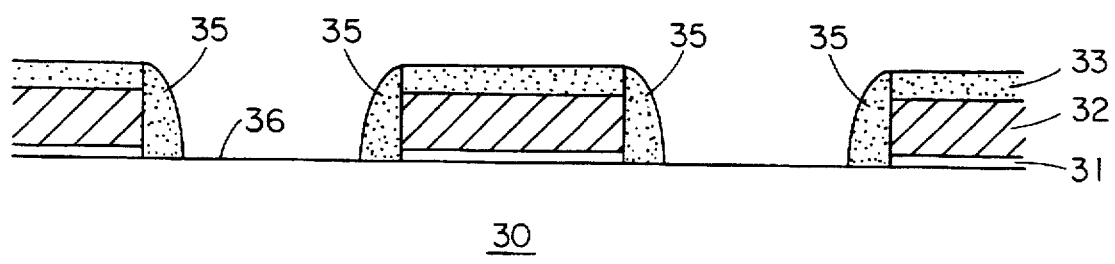

A second oxide layer is then deposited on the surface of the semiconductor substrate, including in the formed openings and on the upper surface of nitride layer 32 or optional intermediate oxide layer 33, and on the side surfaces of pad-oxide 31, nitride 32 and optional intermediate oxide 33 layers. Etching, preferably anisotropic etching, is then conducted to remove the second oxide layer from the top surface of nitride layer 32, or optional intermediate oxide layer 33, and semiconductor substrate 30 leaving sidewall spacers 35 on the side surfaces of pad-oxide 31, nitride 32 and optional intermediate oxide 33 layers extending to the surface of the semiconductor substrate 36 as shown in FIG. 4.

Figure 5:
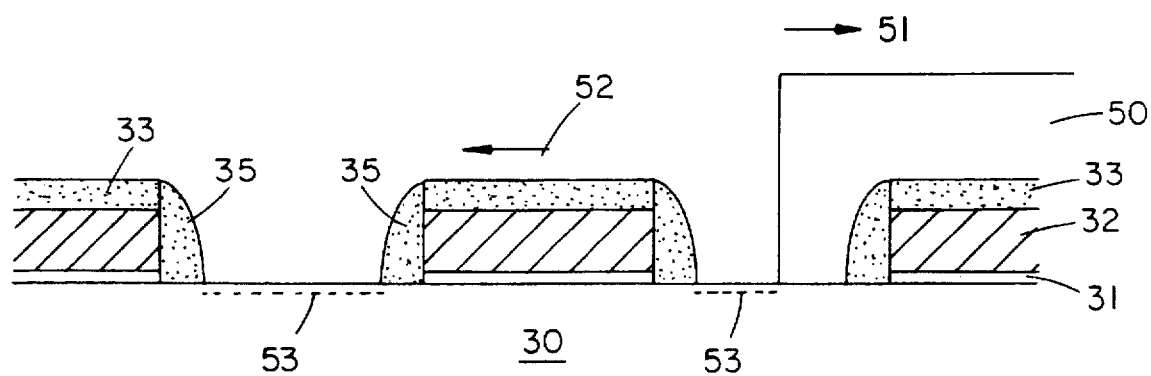

The next stage is illustrated in FIG. 5 in the context of manufacturing a CMOS structure, although the present invention is not limited with respect to such structures. As shown in FIG. 5, photoresist resin 50 is deposited to separate the P-MOS region 51 from the N-MOS region 52. An impurity of the first conductivity type, e.g., a P-type impurity such as boron, is then ion implanted in semiconductor substrate 30 to form channel-stopper region 53 in a self-aligned manner using pad oxide 31, nitride 32 and optional intermediate oxide 33 layers as masking layers. The presence of sidewall spacers 35 minimizes, preferably prevents, the extension of channel-stopper impurities into the region of the semiconductor substrate in proximity to the end or bird's beak of the subsequently formed field oxide region.

Figure 6:
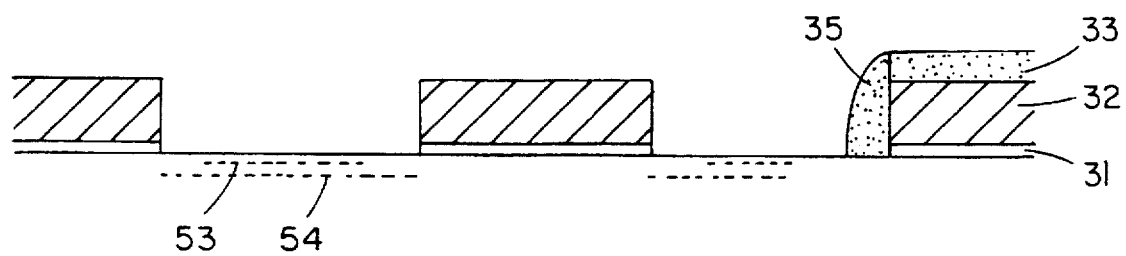

After ion implantation of channel-stopper regions 53, sidewall spacers 35 are removed by etching together with optional intermediate oxide layer 33 in the N-MOS portion, as shown in FIG. 6, leaving pad oxide 31 and nitride masking layers 32. As an optional step, a second lighter field implant is performed by ion implanting a P-type impurity, such as boron, to form a second channel-stopper region 54 under the first formed channel-stopper region 53.

Figure 7:
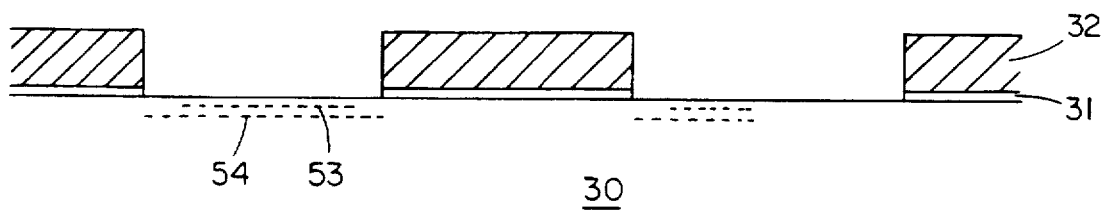
Figure 8:
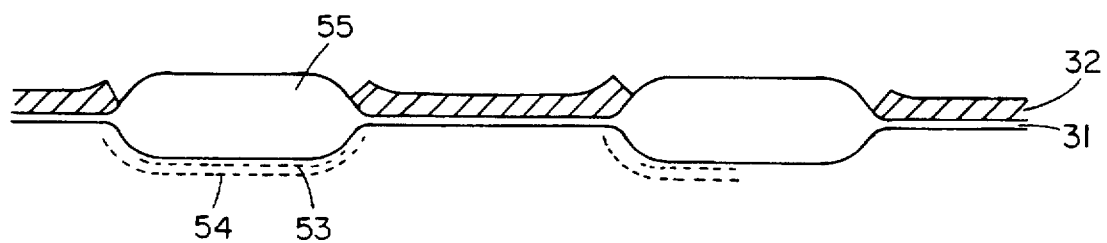

In the stage depicted in FIG. 7, sidewall spacers 35 and optional intermediate oxide layer 33 are removed from the P-MOS section of the semiconductor device. In FIG. 8, field oxide regions 55 are thermally grown. Subsequent processing is in accordance with conventional practices, wherein nitride masking layer 32 is removed and active regions formed.

In another aspect of the present invention, recesses are formed in the semiconductor substrate after forming the openings for the field oxide regions by continuing the etching process prior to depositing the second oxide layer, consistent with the conventional practice of forming a recessed field oxide region. In this aspect of the present invention, the sidewall spacers 35 are formed to extend into the recesses to the exposed surface of semiconductor substrate 30.

The materials and processing techniques, such as deposition, photolithographic, and etching techniques, employed in the present invention are those typically employed in manufacturing conventional semiconductor devices and, hence, are not be set forth herein in detail. The present invention involves a modification of conventional practices for forming a field oxide region, which modification comprises using sidewall spacers to form a self-aligned, ion implanted channel-stopper region under the field oxide region, wherein the channel-stopper impurity concentration under the bird's beak of the field oxide region is significantly reduced. Preferably, the channel-stopper region does not extend into an adjoining source/drain region or to the surface of the semiconductor substrate approximate the bird's beak. The sidewall spacers can be formed from conventional insulating material, such as silicon dioxide, doped silicon dioxide, or phosphorous doped silicate glass (PSG). The optional intermediate oxide layer on the nitride layer can be formed by chemical vapor deposition of silicon dioxide, or doped silicon dioxide.

The nitride layer is typically silicon nitride formed in accordance with conventional techniques for forming a nitride masking layer in the formation of a field oxide region. The semiconductor substrate comprises P-doped or N-doped silicon, preferably P-doped, as with boron.

Thus, by the present invention, a semiconductor device is formed having a tailored channel-stopper region wherein the concentration channel-stopper impurities under the bird's beak of a field oxide region is significantly reduced. Preferably, the channel-stopper region does not extend into an adjoining source/drain region or to the semiconductor substrate surface adjacent the bird's beak portion of the field oxide region. The resulting semiconductor device is advantageously characterized by a reduced narrow-channel effect, reduced the sidewall junction capacitance and increased junction breakdown voltage. Although the present invention is applicable to various types of semiconductor devices, it enjoys particularly utility in semiconductor devices designed for high voltage technology requiring heavy field implantations. The present invention solves known problems associated with channel-stopper regions in a simplified manner, thereby enabling the manufacture semiconductor devices, such as programmable logic devices and flash memory devices, which require higher doping under the field oxide region. The present invention is, therefore, applicable to any C-MOS technology, particularly non-volatile memory devices.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device, which method comprises:

forming a first oxide layer on a semiconductor substrate, wherein the semiconductor substrate contains an impurity of a first conductivity type;

forming a nitride layer on the first oxide layer;

patterning and etching the nitride and first oxide layers to form openings extending to and exposing the semiconductor substrate, and forming and exposing side surfaces of the first oxide and nitride layers;

depositing a second oxide layer on the exposed surface of the semiconductor substrate, top surface of the nitride layer and exposed side surfaces of the nitride and first oxide layers;

etching to remove the second oxide layer from the semiconductor substrate and top surface of the nitride layer leaving sidewall spacers of the second oxide on the side surfaces of the nitride and first oxide layers, which sidewall spacers extend to the surface of the semiconductor substrate;

ion implanting an impurity of the first conductivity type into the substrate in a region between the sidewall spacers to form a first channel-stopper region therein containing the impurity of the first conductivity type at a concentration greater than the concentration of the impurity of the first conductivity type in the substrate;

removing the sidewall spacers; and ion implanting an impurity of the first conductivity type into the substrate beneath the first channel-stopper region to form a second channel-stopper region having an impurity concentration of the first conductivity type less than the impurity concentration of the first conductivity type in the first channel-stopper region and greater than the impurity concentration of the first conductivity type in the substrate.

2. The method according to claim 1, further comprising forming field oxide regions in the openings by thermal treatment.

3. The method according to claim 1, wherein the impurity of the first conductivity type is a P-type impurity.

4. The method according to claim 3, wherein the P-type impurity is boron.

5. The method according to claim 1, wherein etching to form the openings is continued to etch a portion of the substrate to form a recess therein, and the second oxide is removed from the recess by etching.

6. The method according to claim 5, wherein the field oxide region is formed in the recess.

7. The method according to claim 1, wherein the semiconductor device comprises a C-MOS structure.

8. The method according to claim 1, wherein the first oxide layer is formed by thermal oxidation.

9. The method according to claim 1, wherein the nitride layer is formed by chemical vapor deposition.

10. The method according to claim 1, wherein the second oxide layer is formed by chemical vapor deposition.

11. The method according to claim 8, wherein the second oxide comprises silicon dioxide containing an impurity dopant.

12. The method according to claim 10, wherein the second oxide comprises phosphorous doped silicate glass.

13. The method according to claim 1, further comprising forming an intermediate oxide layer on the nitride layer prior to patterning and etching.

14. The method according to claim 13, wherein the intermediate oxide is formed by chemical vapor deposition.

* * * * *